(12) United States Patent
Knoop

(10) Patent No.: US 8,659,905 B2
(45) Date of Patent: Feb. 25, 2014

(54) ASEISMIC SERVER RACK

(75) Inventor: Franz Josef Knoop, Büren-Steinhausen (DE)

(73) Assignee: Fujitsu Siemens Computers GmbH, Munich (DE)

(*) Notice: Subject to any disclaimer, the term of this patent is extended or adjusted under 35 U.S.C. 154(b) by 1606 days.

(21) Appl. No.: 11/609,985

(22) Filed: Dec. 13, 2006

(65) Prior Publication Data
US 2007/0144993 A1 Jun. 28, 2007

Related U.S. Application Data

(63) Continuation of application No. PCT/DE2005/001699, filed on Sep. 26, 2005.

(30) Foreign Application Priority Data

Oct. 12, 2004 (DE) .......................... 10 2004 049 681

(51) Int. Cl.
*H05K 5/02* (2006.01)

(52) U.S. Cl.
CPC ...................................... *H05K 5/02* (2013.01)
USPC ................... 361/724; 312/223.2; 312/351.14; 312/265.3

(58) Field of Classification Search
USPC ................ 312/223.1, 351.13, 351.14, 265.1, 312/265.2, 265.3, 265.4, 111, 198, 199, 312/223.2; 361/679.6, 679.31, 679.59, 724
See application file for complete search history.

(56) References Cited

U.S. PATENT DOCUMENTS

| | | | | |
|---|---|---|---|---|
| 2,058,263 A | * | 10/1936 | Rosendale | ................. 312/265.4 |
| 5,323,916 A | | 6/1994 | Salmon | |
| 5,392,192 A | * | 2/1995 | Dunn et al. | ................. 361/679.6 |
| 5,769,519 A | | 6/1998 | Nicolai | |
| 6,134,858 A | | 10/2000 | Gutelius, Jr. et al. | |
| 6,301,837 B1 | | 10/2001 | Ray | |
| 6,634,615 B1 | | 10/2003 | Bick et al. | |

FOREIGN PATENT DOCUMENTS

| | | |
|---|---|---|
| DE | 4232034 A1 | 3/1994 |
| DE | 4234836 A1 | 4/1994 |
| DE | 10202845 C1 | 8/2003 |
| JP | 2004147957 | 5/2004 |

* cited by examiner

*Primary Examiner* — Michael Safavi
(74) *Attorney, Agent, or Firm* — Edell, Shapiro & Finnan, LLC

(57) ABSTRACT

An aseismic (earthquake-secure) server rack is fastened to an earthquake frame in order to increase rigidity and is fixed to the floor at least via the earthquake frame.

11 Claims, 3 Drawing Sheets

ASEISMIC SERVER RACK

CROSS REFERENCE TO RELATED APPLICATIONS

This application is a continuation of International Application No. PCT/DE 2005/001699 filed Sep. 26, 2005, which claims priority under 35 U.S.C. §119 to Application No. DE 102004049681.1 filed on Oct. 12, 2004, entitled "Aseismic Server Rack," the entire contents of which are hereby incorporated by reference.

BACKGROUND

Most server racks have rollers for transportation purposes and are generally installed using four supporting feet, the supporting feet being used to compensate for unevenness in the floor by screwing the supporting feet into, and unscrewing the supporting feet from, the frame.

Computation units or slide-in units are screwed into the frame of the server rack, which is generally formed from a base frame, corner pillars and an upper frame. The slide-in units use telescopic rails allowing them to be pulled out of the front. Server racks are generally approximately 2 m high, 1 m deep and 70 cm wide.

Due to the weight of the computer components held, in particular if the server rack is top-heavy due to installing the components predominantly at chest and eye level, the server rack can be subjected to severe loads in the event of an earthquake, and there is the risk of tipping over causing damage to the computer units. Consequently, the computer units must be screwed in and care must be taken to avoid damaging the cabling in the process.

SUMMARY

An aseismic server rack having an essentially cuboidal frame which can be produced in a simple and cost-effective manner is described herein. To increase rigidity, the aseismic server rack is fastened (e.g., screwed) to an earthquake frame and can be fixed to the floor at least via the earthquake frame.

The earthquake frame and the server rack are preferably screwed together on the front and/or rear side of the server rack. However, it is likewise also possible for the earthquake frame and server rack be screwed together on one or both side walls of the server rack.

The earthquake frame considerably strengthens the frame of the server rack. The earthquake frame may have the same cross section as the server rack, with the result that, after the earthquake frame has been screwed to the server rack, the depth of the server rack including the earthquake frame is increased by the depth of the earthquake frame.

The points at which the earthquake frame and the server rack can be screwed together may be provided over the entire perimeter between the earthquake frame and the server rack, so that the entire frame of the server rack is uniformly strengthened. Thus, according to one exemplary embodiment, the earthquake frame is arranged on the rear side of the server rack and is screwed to the server rack over the entire perimeter. In this embodiment, it is advantageous if the earthquake frame has cable apertures for vertical and horizontal cabling since the earthquake frame can then be preinstalled and the server cabinets or server racks merely have to be pushed onto the earthquake frame and screwed to the latter. In the case of a plurality of server racks which are arranged in a row, it is extremely advantageous, when replacing a server rack, if the horizontal cabling between the server racks is not looped through the frame of the server racks but rather can be pulled through the cable apertures in the earthquake frame, as in the device described. It is also advantageous to provide a cable aperture on the top side of the earthquake frame for vertical cabling from the ceiling.

Fixing the earthquake frame to the floor prevents the entire server rack, including the earthquake frame, from tipping over in the event of an earthquake. The earthquake frame can be screwed to the floor using lugs but may also be fixed to the floor using other fastening mechanisms.

The earthquake frame can also be provided with hinges for holding the front or rear door of the server rack, so that, when installing the server rack with the earthquake frame, only the respective door has to be removed and the server rack has to be screwed to the earthquake frame. The door is then hung on the earthquake frame, thus again producing a desirable overall visual impression, with the server rack including the earthquake frame forming a closed unit. In order to increase the stability of the server rack including the earthquake frame, bores can be provided in the base frame of the server rack, the bores allowing both the front side and the rear side of the frame of the server rack to be screwed to the floor.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to exemplary embodiments.

DETAILED DESCRIPTION

Figure 1:
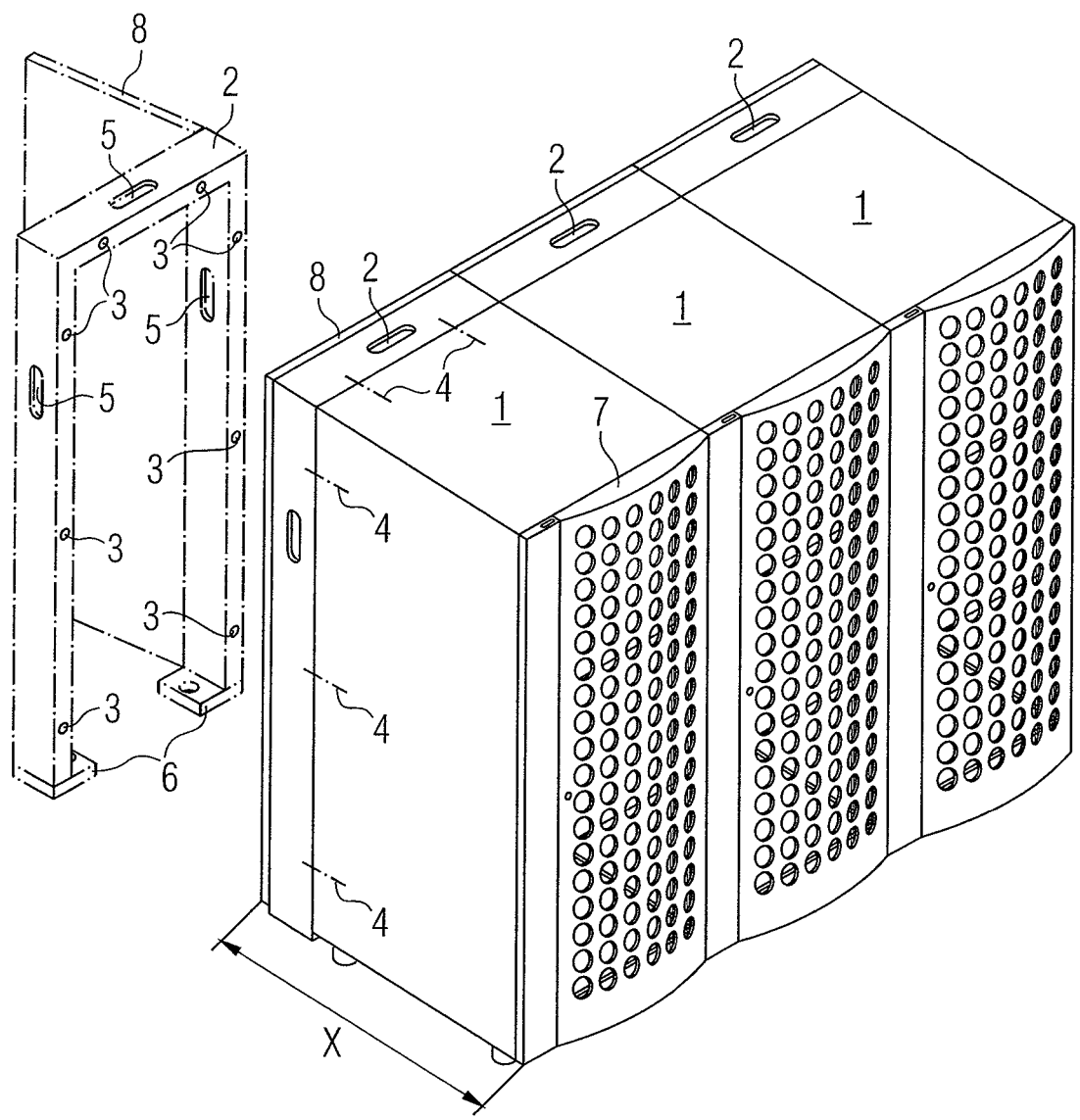
FIG. 1 shows a perspective illustration of three server racks, which are arranged adjacent to one another, with each rack having an earthquake frame arranged behind it, and a dashed illustration of an individual earthquake frame in isolation.

FIG. 1 shows a perspective illustration of three server racks 1 which are arranged next to one another and are connected to an earthquake frame 2 on the rear side. An individual earthquake frame 2 is also illustrated using dashed lines behind the first server rack 1. In cross section, the earthquake frame 2 is in the form of a U which is open toward the bottom and can be screwed to the server rack 1 from behind. To this end, the earthquake frame 2 has corresponding bores 3 which are aligned with corresponding bores 4 on the rear side of the server rack 1.

The material and rigidity of the earthquake frame 2 are designed such that, after it has been screwed to the server rack 1, the earthquake frame considerably strengthens the latter and thus makes it more stable and less sensitive to the effects of an earthquake. To this end, the earthquake frame 2 is preferably integrally formed from steel.

In order to facilitate horizontal cabling between the server racks and also for easy cable supply from above, the earthquake frame has cable apertures 5 on both the side part and the upper central part. Formation of the cable apertures 5 has the advantage that the earthquake frame can be preassembled and the horizontal cabling can be laid in advance. Subsequently, the server rack can be pushed against the preassembled earthquake frame 2 and screwed to the latter via the bores 3, 4.

In order to fix the earthquake frame to the floor, lugs 6 are provided on the earthquake frame, the lugs allowing the earthquake frame 2 to be screwed to the floor. The server racks 1 generally have a front door 7 and a rear door 8.

Before the earthquake frame 2 is screwed to the server rack, only the appropriate door must be removed, which door can then be hung again on corresponding hinges on the earthquake frame 2. This is the rear door 8 in the exemplary embodiment illustrated.

If server racks of different makes and with different depths are used, the overall depth X of the server racks 1 including the earthquake frames 2 can also be matched to one another using different depths of the earthquake frames.

Figure 2:
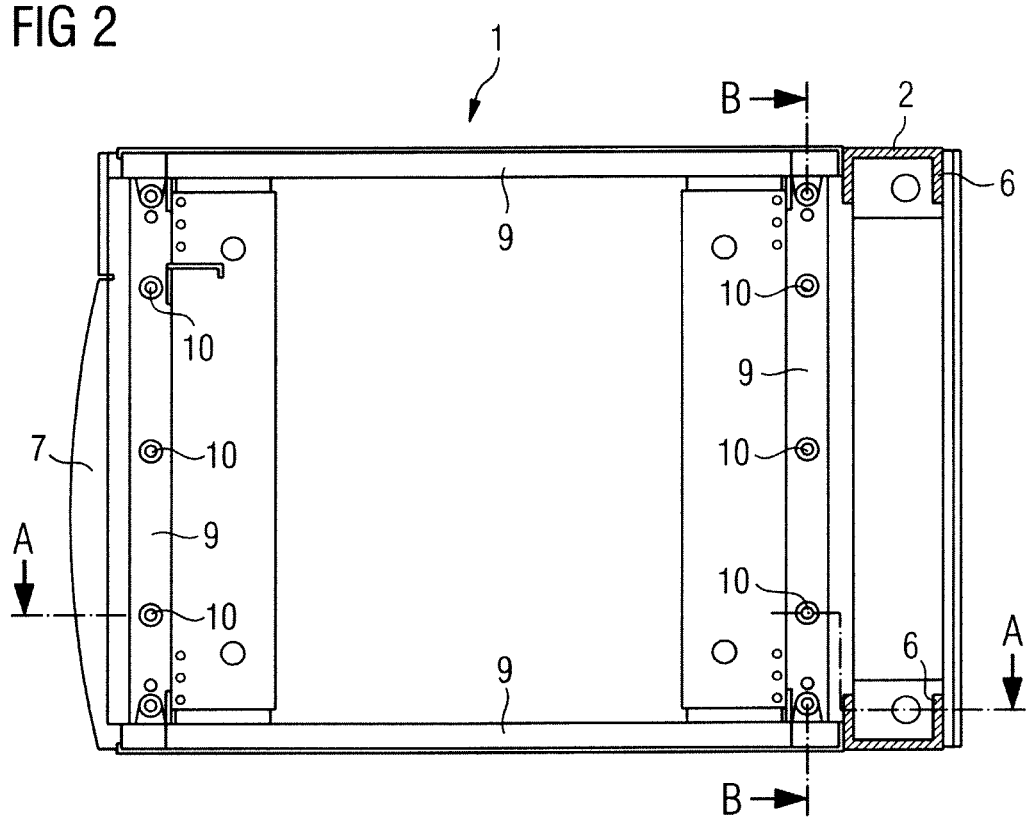
FIG. 2 shows a diagrammatic sectional view in plan of a server rack having an earthquake frame.

FIG. 2 shows a diagrammatic sectional view in plan of a server rack 1 with an earthquake frame 2 arranged behind it. The server rack has a cuboidal frame with an essentially rectangular base frame 9. In addition to the earthquake frame, bores 10 which are used to screw the server rack to the floor via heavy-duty anchors are likewise provided in the base frame 9. In the exemplary embodiment illustrated, three bores 10 for screwing to the floor are respectively provided in the base frame 9 both on the front side and on the rear side of the server rack. The earthquake frame 2 likewise has bores in the inward projecting lugs 6, the bores being used to screw the earthquake frame 2 to the floor via heavy-duty anchors.

Solely screwing the server rack to the floor does not suffice for earthquake protection in most cases since the server rack has inadequate rigidity and would deform, in the event of a minor earthquake, to such an extent that the frame of the server rack would be damaged or would snap.

Figure 3:
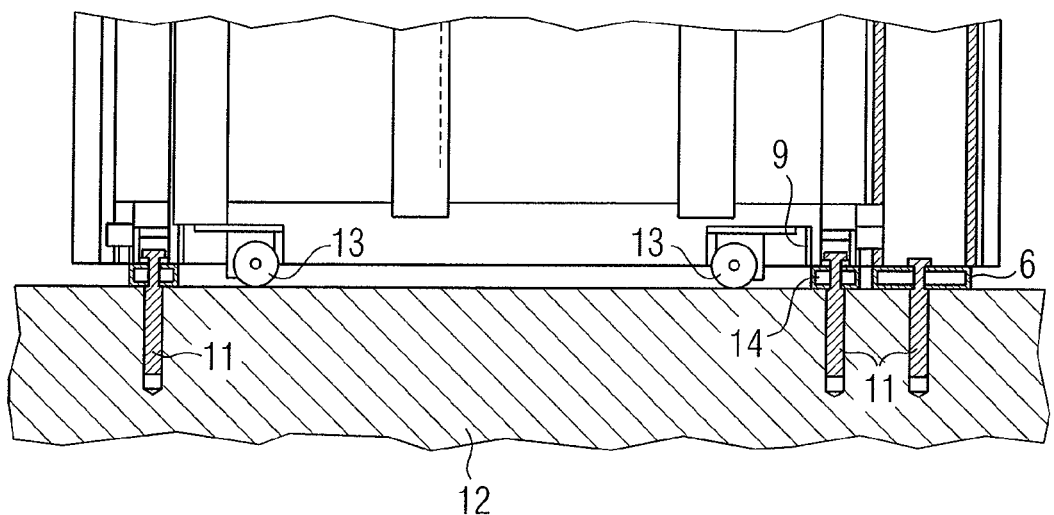
FIG. 3 shows the section AA from FIG. 2.

FIG. 3 shows the section AA through FIG. 2, part of the floor 12 also being illustrated. The base frame 9 and the earthquake frame 2 are screwed to the floor 12 via heavy-duty anchors 11. The server rack 1 is normally on rollers 13 and/or supporting feet. The rollers 13 make it possible for the server rack to be easily pushed onto the preassembled earthquake frame 2 for the purposes of installation. In order to avoid exerting excessive loading on the rollers 13 when screwing via the heavy-duty anchors 11, in particular when screwing via the bores 10 in the base frame 9, a quadrilateral tube is respectively provided between the base frame 9 and the floor 12 as a spacer 14.

Figure 4:
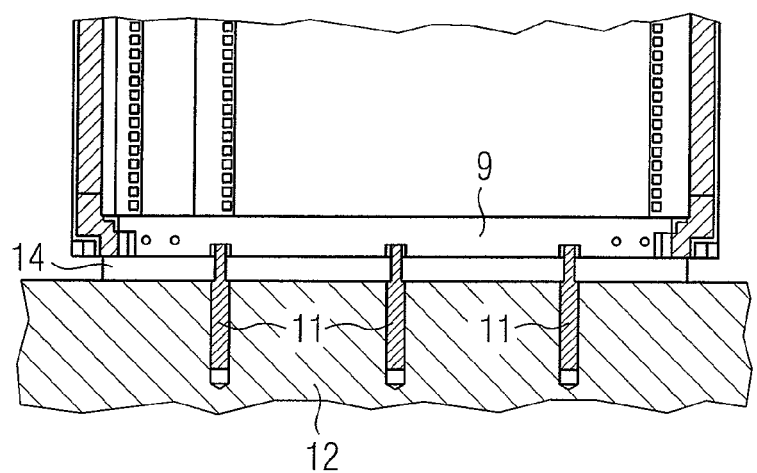
FIG. 4 shows the section BB from FIG. 2.

FIG. 4 shows the section BB through FIG. 2. In the exemplary embodiment illustrated, the base frame 9 is screwed to the floor 12 in three places via the heavy-duty anchors 11.

While the device has been described in detail with reference to specific embodiments thereof, it will be apparent to one of ordinary skill in the art that various changes and modifications can be made therein without departing from the spirit and scope thereof. Accordingly, it is intended that the described device covers the modifications and variations of this device provided they come within the scope of the appended claims and their equivalents.

What is claimed is:

1. An aseismic server rack system, comprising:
A server rack comprising a substantially cuboidal server-rack-frame forming a full cabinet structure with an essentially rectangular base frame, corner pillars and an essentially rectangular upper frame, wherein:
the serverrack-frame comprises a front side and a rear side opposite to the front side;
the rear side and the front side comprise hinges for holding a door of the server rack system; and
the serverrack-frame is capable of being fixed to a floor; and
an earthquake frame including lugs for being fixed to the floor separately from the serverrack-frame and including at least one hinge configured to hold a door of the server rack system,
wherein the earthquake frame is arranged on the rear side or the front side of the serverrack-frame and fixed thereto over an entire perimeter thereof such that a depth of the server rack is increased and the serverrack-frame of the server rack is strengthened.

2. An aseismic server rack system, comprising:
a server rack comprising a substantially cuboidal server-rack-frame forming a full cabinet structure with an essentially rectangular base frame, corner pillars, and sides between the pillars, wherein
the sides of the serverrack-frame comprise a front side and a rear side opposite to the front side; and
an earthquake frame capable of being fixed to a floor, the earthquake frame including at least one hinge configured to hold a door of the server rack system,
wherein the earthquake frame is arranged on the rear side or the front side of the serverrack-frame and fixed thereto over an entire perimeter thereof such that a depth of the server rack is increased and the serverrack-frame of the server rack is strengthened.

3. The aseismic server rack system as claimed in claim 2, wherein the server rack is screwed to the earthquake frame.

4. The aseismic server rack system as claimed in claim 2, wherein the earthquake frame is fastened to a rear side of the server rack.

5. The aseismic server rack system as claimed in claim 2, wherein the earthquake frame comprises at least one cable aperture for vertical and/or horizontal cabling.

6. The aseismic server rack system as claimed in claim 2, wherein the earthquake frame has a same cross sectional dimension as the server rack such that, after being fastened to the server rack, the earthquake frame extends a depth of the server rack.

7. The aseismic server rack system as claimed in claim 2, wherein the earthquake frame is configured to be screwed to the floor with lugs.

8. The aseismic server rack system as claimed in claim 2, wherein the base frame of the server rack includes at least one bore for receiving an anchor for screwing the base frame to the floor.

9. The aseismic server rack system as claimed in claim 8, wherein both a front side and a rear side of the server rack are fixed to the floor via the base frame.

10. The aseismic server rack system as claimed in claim 2, further comprising at least one spacer disposed between the server rack and the floor.

11. An aseismic server rack system, comprising:
a server rack comprising a substantially cuboidal server-rack-frame forming a full cabinet structure with an essentially rectangular base frame, corner pillars, and sides between the pillars, wherein:
the sides of the serverrack-frame comprise a front side and a rear side opposite to the front side; and
the rear side and the front side comprise hinges for holding a door of the server rack system; and
an earthquake frame capable of being fixed to a floor, the earthquake frame including at least one hinge configured to hold a door of the server rack system, wherein the earthquake frame is arranged on the rear side or the front side of the serverrack-frame and fixed thereto over an entire perimeter thereof such that a depth of the server rack is increased and the serverrack-frame of the server rack is strengthened.

* * * * *